(12) United States Patent
Chao et al.

(10) Patent No.: US 7,557,621 B2
(45) Date of Patent: Jul. 7, 2009

(54) DIVIDER

(75) Inventors: Ting-Sheng Chao, Hsinchu (TW);
Wei-Bin Yang, Taichung County (TW);
Yu-Lung Lo, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 72 days.

(21) Appl. No.: 11/853,819

(22) Filed: Sep. 12, 2007

(65) Prior Publication Data

US 2008/0303562 A1  Dec. 11, 2008

(30) Foreign Application Priority Data

Jun. 5, 2007 (TW) ............... 96120072 A

(51) Int. Cl.
*H03K 23/00* (2006.01)
*H03K 21/00* (2006.01)
(52) U.S. Cl. .................... 327/115; 327/117; 327/118; 377/47; 377/48
(58) Field of Classification Search ............... None
See application file for complete search history.

(56) References Cited

U.S. PATENT DOCUMENTS

| 4,331,926 | A | * | 5/1982 | Minakuchi | ........... 377/110 |
| 5,930,322 | A | | 7/1999 | Yang et al. | |
| 6,822,491 | B1 | * | 11/2004 | Glass | ........... 327/115 |
| 6,847,239 | B2 | * | 1/2005 | Leifso et al. | ........... 327/117 |
| 2004/0160247 | A1 | * | 8/2004 | Magoon et al. | ........... 327/115 |
| 2007/0041484 | A1 | * | 2/2007 | Khanoyan | ........... 375/376 |

OTHER PUBLICATIONS

Article titled "A New Dynamic Floating Input D Flip-Flop (DFIDFF) for High Speed and Ultra Low Voltage Divided-by 4/5 Prescaler," authored by Jau et al. 13th IEEE International Conference on Electronics, Circuits, and System, pp. 902-905, Dec. 10-13, 2006.
Article titled "A 1.6-GHz Dual Modulus Prescaler Using the Extended True-Single-Phase-Clock CMOS Circuit Technique (E-TSPC)," authored by Navarro et al. IEEE J. Solid-State Circuits, vol. 34, pp. 97-102, Jan. 1999.
Article titled "New Dynamic Flip-Flops for High-Speed Dual-Modulus Prescaler," authored by Yang et al. IEEE J. Solid-State Circuits, vol. 33, No. 10, Oct. 1998 (pp. 1568-1571).
Article titled "Extended TSPC Structures With Double Input/Output Data Throughput for Gigahertz CMOS circuit Design," authored by Navarro et al. IEEE Transactions on Very Large Scale Integration (VLSI) systems, vol. 10, No. 3, Jan. 2002.(pp. 301-308).

* cited by examiner

*Primary Examiner*—Tuan Lam
*Assistant Examiner*—Hiep Nguyen
(74) *Attorney, Agent, or Firm*—Jianq Chyun IP Office

(57) ABSTRACT

A divider is provided. The divider includes a first flip-flop, a flip-flop array, a first NOT gate, a second NOT gate, and a circuit. The first flip-flop can be triggered by a frequency signal. The first NOT gate is coupled between a positive output terminal of the last second flip-flop and the first flip-flop. The second NOT gate is coupled between the positive output terminal of the last second flip-flop and the circuit. The first NOT gate and the second NOT gate are controlled by the mode control signal for enabling. If N is an odd number, the circuit includes a wire, and if N is an even number, the circuit includes a third NOT gate.

10 Claims, 11 Drawing Sheets

US 7,557,621 B2

DIVIDER

CROSS-REFERENCE TO RELATED APPLICATION

This application claims the priority benefit of Taiwan application serial no. 96120072, filed Jun. 5, 2007. All disclosure of the Taiwan application is incorporated herein by reference.

BACKGROUND OF THE INVENTION

1. Field of the Invention

The present invention generally relates to a divider, and more particularly, to a divided-by-2N divider or a divided-by-(2N+1) divider.

2. Description of Related Art

Currently, as processing technologies advance, hand-held electronic products have become essential tools for human's daily life. In designing hand-held electronic products, reducing power consumption for extending lifetimes of batteries thereof, as well as lifetime of the hand-held electronic products are important issues. Referring to the equation of power consumption, i.e., $P=\alpha cv^2 f$, wherein P is power consumption; $\alpha$ is an activity coefficient; v is a voltage value; and f is an operation frequency, it can be learnt that lowering operation voltage is the best way to reduce power consumption. However, in practical operation, lowering the operation frequency is often a must corresponding to the operation of lowering the operation voltage. Therefore, the concerns are turned to how to operate under a circumstance of a higher speed and a lower voltage.

For example, in a wireless communication system, a frequency synthesizer is often a very important basic unit, in which features of a press control oscillator and a divider including a pre-divider and a programmable counter circuit often determine performance of the frequency synthesizer in its entirety. FIG. 1A is a circuit diagram of a conventional divided-by-(⅔) divider. Conventional dividers are constituted of logic gates and D flip-flops. When a mode control signal MC is logic "0", an output frequency OUT of the divider shown in FIG. 1A is equal to an input frequency CLOCK divided by 2. When the mode control signal MC is logic "1", the output frequency OUT of the divider is equal to the input frequency CLOCK divided by 3. FIG. 1B is a circuit diagram of a conventional divided-by-(⅘) divider. When a mode control signal MC is logic "0", an output frequency OUT of the divider shown in FIG. 1B is equal to an input frequency CLOCK divided by 4. When the mode control signal MC is logic "1", the output frequency OUT of the divider is equal to the input frequency CLOCK divided by 5.

SUMMARY OF THE INVENTION

The present invention is directed to a divider, which is adapted for dividing 2N or 2N+1.

The divider includes a first flip-flop, a flip-flop array, a first NOT gate, a second NOT gate, and a circuit. The first flip-flop can be triggered by a frequency signal, and is controlled by a mode control signal for enabling. The flip-flop array includes N second flip-flops which can be triggered by the frequency signal, wherein N is an integer greater than 0. A negative output terminal of each second flip-flop of the flip-flop array is coupled to an input terminal of an adjacent second flip-flop. An input terminal of the first NOT gate is coupled to a positive output terminal of the last second flip-flop of the flip-flop array. An output terminal of the first NOT gate is coupled to an input terminal of the first flip-flop. An input terminal of the second NOT gate is coupled to the positive output terminal of the last second flip-flop of the flip-flop array. The first NOT gate and the second NOT gate are controlled by the mode control signal for enabling. If N is an odd number, the circuit includes a wire. The wire comprises a terminal coupled to the output terminal of the first flip-flop and the output terminal of the second NOT gate, and the other terminal coupled to an input terminal of the first second flip-flop of the flip-flop array. If N is an even number, the circuit includes a third NOT gate. The third NOT gate comprises an input terminal coupled to the output terminal of the first flip-flop and the output terminal of the second NOT gate, and an output terminal coupled to an input terminal of the first second flip-flop of the flip-flop array.

The present invention also provides a divider. The divider includes a first flip-flop, a flip-flop array, a first switch, a second switch, a third switch and a circuit. The first flip-flop can be triggered by a frequency signal. The flip-flop array includes N second flip-flops, which can be triggered by the frequency signal, wherein N is an integer greater than 0. A negative output terminal of each second flip-flop of the flip-flop array is coupled to an input terminal of an adjacent second flip-flop. A first terminal of the first switch is coupled to a negative output terminal of the last second flip-flop of the flip-flop array. A second terminal of the first switch is coupled to an input terminal of the first flip-flop. A first terminal of the second switch is coupled to the negative output terminal of the last second flip-flop of the flip-flop array. A first terminal of the third switch is coupled to the output terminal of the first flip-flop. A second terminal of the third switch is coupled to a second terminal of the second switch. The first, second and third switches are controlled for conduction by a mode control signal. If N is an odd number, the circuit includes a wire. The wire comprises a terminal coupled to the second terminal of the second switch, and the other terminal coupled to the input terminal of the first second flip-flop of the flip-flop array. If N is an even number, the circuit includes a third NOT gate. The third NOT gate comprises an input terminal coupled to the second terminal of the second switch, and an output terminal coupled to an input terminal of the first second flip-flop of the flip-flop array.

The present invention determines dividing times of the divider by determining the number of N, i.e., number of the second flip-flops.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
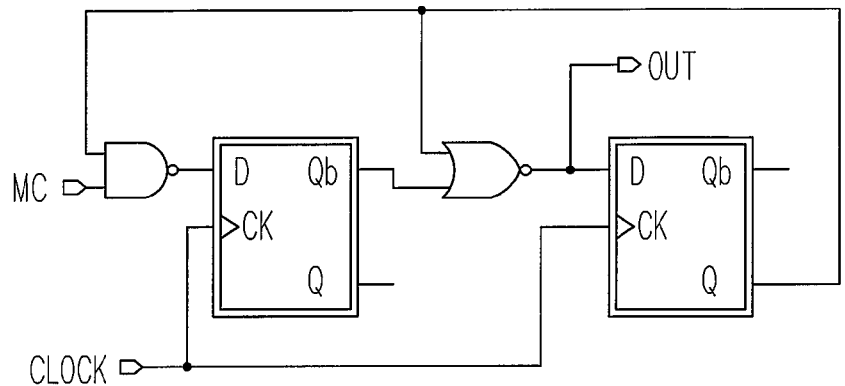
FIG. 1A is a circuit of a conventional divided-by-(⅔) divider.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
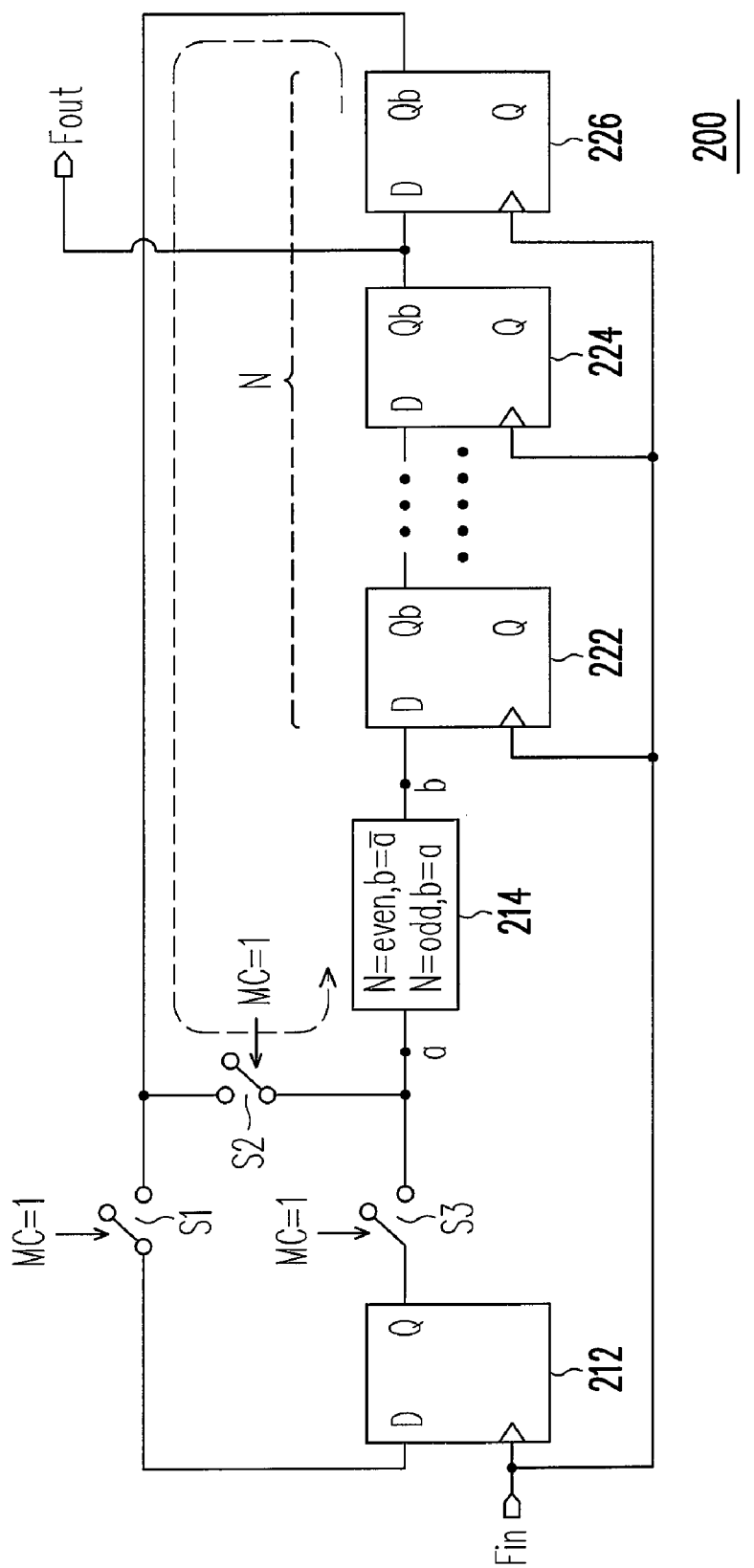
FIGS. 2A and 2B are circuits of a divided-by-2N or divided-by-(2N+1) divider according to an embodiment of the present invention.
Figure 2B:
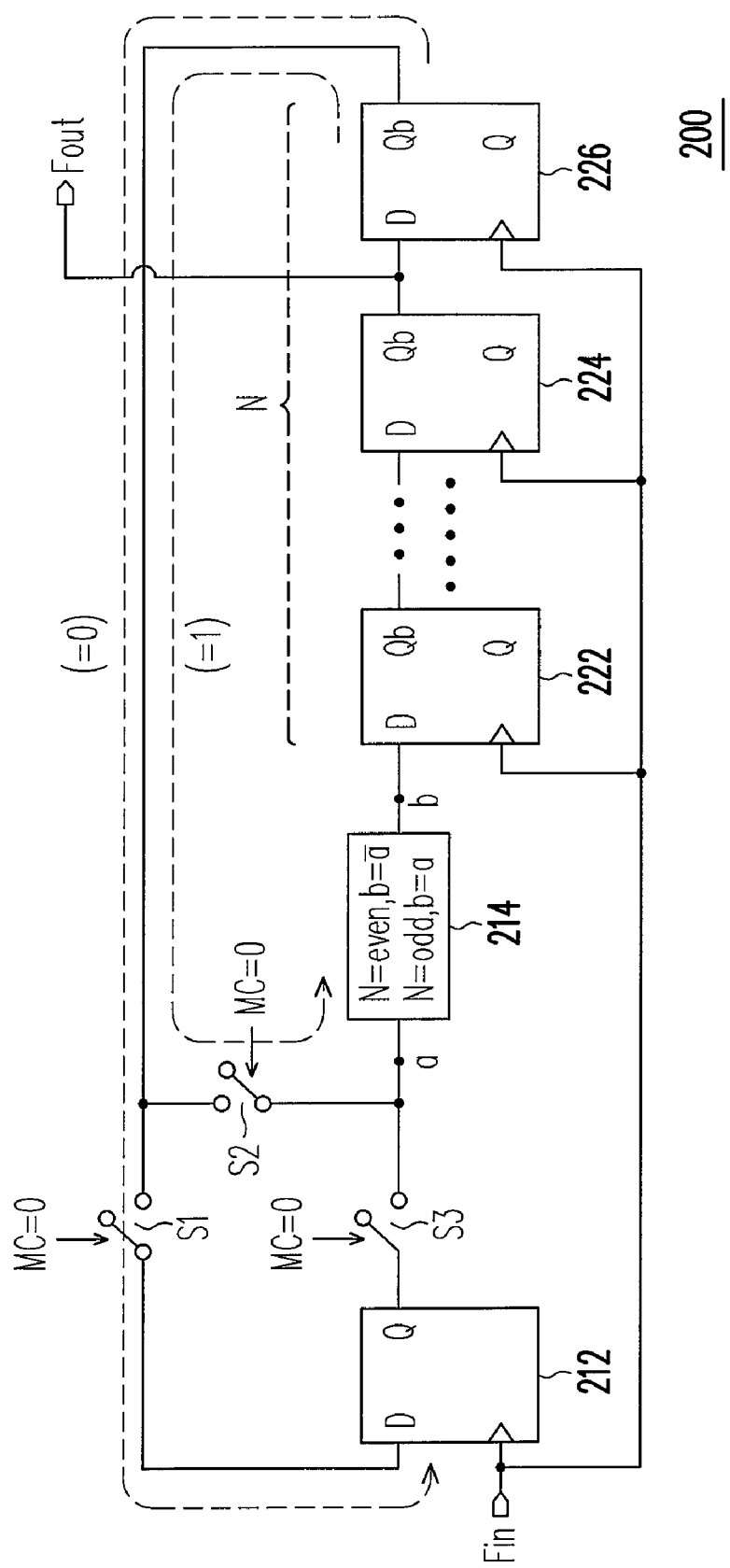

FIGS. 2A and 2B are circuit of a divided-by-2N or divided-by-(2N+1) divider according to an embodiment of the present invention. Referring to FIGS. 2A and 2B, a divider 200 includes a first flip-flop 212, a flip-flop array including N second flip-flops 222, 224, 226 ... connected in series, a first switch S1, a second switch S2, a third switch S3, and a circuit 214, wherein N is an integer greater than 0. The first flip-flop 212 and the N second flip-flops 222 to 226 of the flip-flop array are controlled for enabling by a frequency signal Fin. In the flip-flop array, a negative output terminal Qb of each second flip-flop 222 to 226 of the flip-flop array is coupled to an input terminal D of an adjacent second flip-flop. It should be noted that although D flip-flops are exemplified for illustrating the present invention, other types of flip-flops may also be adopted according to actual requirements.

The first switch S1 comprises a first terminal coupled to a negative output terminal Qb of the last second flip-flop 226 of the flip-flop array, and a second terminal coupled to an input terminal D of the first flip-flop 212. The second switch S2 has a first terminal coupled to the negative output terminal Qb of the last second flip-flop 226 of the flip-flop array. The third switch S3 has a first terminal coupled to an output terminal Q of the first flip-flop 212, and a second terminal coupled to a second terminal of the second switch S2. The switches S1, S2, and S3 are controlled by a mode control signal MC for conduction.

If N is an odd number, then the circuit 214 includes a wire. The wire comprises a terminal coupled to the second terminal of the second switch S2, and another terminal coupled to an input terminal D of the first second flip-flop 222 of the flip-flop array. If N is an even number, then the circuit 214 includes a third NOT gate. The third NOT gate has an input terminal coupled to the second terminal of the second switch S2, and an output terminal coupled to the input terminal D of the first second flip-flop 222 of the flip-flop array.

FIG. 2A exemplarily illustrates that when the mode control signal MC is logic "1", the divider 200 is a divided-by-2N divider. Referring to FIG. 2A, when the mode control signal MC is logic "1", the first switch S1 and the third switch S3 are turned off, and the second switch S2 is turned on. Therefore, an output of the last second flip-flop 226 is transmitted to the first second flip-flop 222 via the second switch and the circuit 214 without passing through the first flip-flop 212. As such, a divided-by-2N divider is configured where an output frequency Fout of the divider 200 is equivalent to the input frequency signal Fin divided by 2N.

FIG. 2B exemplarily illustrates that when the mode control signal MC is logic "0", the divider 200 is a divided-by-(2N+1) divider. Referring to FIG. 2B, when the mode control signal MC is logic "0", the first switch S1 and the third switch S3 are turned on, and the second switch S2 is turned off. Therefore, logic "0", which is equivalent to logic "1" of the output frequency Fout, outputted from the last second flip-flop 226 passes through the first flip-flop 212, which is delayed one duty cycle of the input frequency signal Fin before the logic "0" arrives the first second flip-flop 222 via the circuit 214. After an output of the last second flip-flop 226 is changed from logic "0" to logic "1", which is equivalent to a change of the output frequency Fout from logic "1" to logic "0", the first switch S1 and the third switch S3 are turned off, and the second switch S2 is turned on, in which logic "1" cannot pass through the first flip-flop 212. As such, a divided-by-(2N+1) divider is configured by repeating the foregoing operation, in which an output frequency Fout of the divider 200 is equivalent to the input frequency signal Fin divided by 2N+1.

Figure 2C:
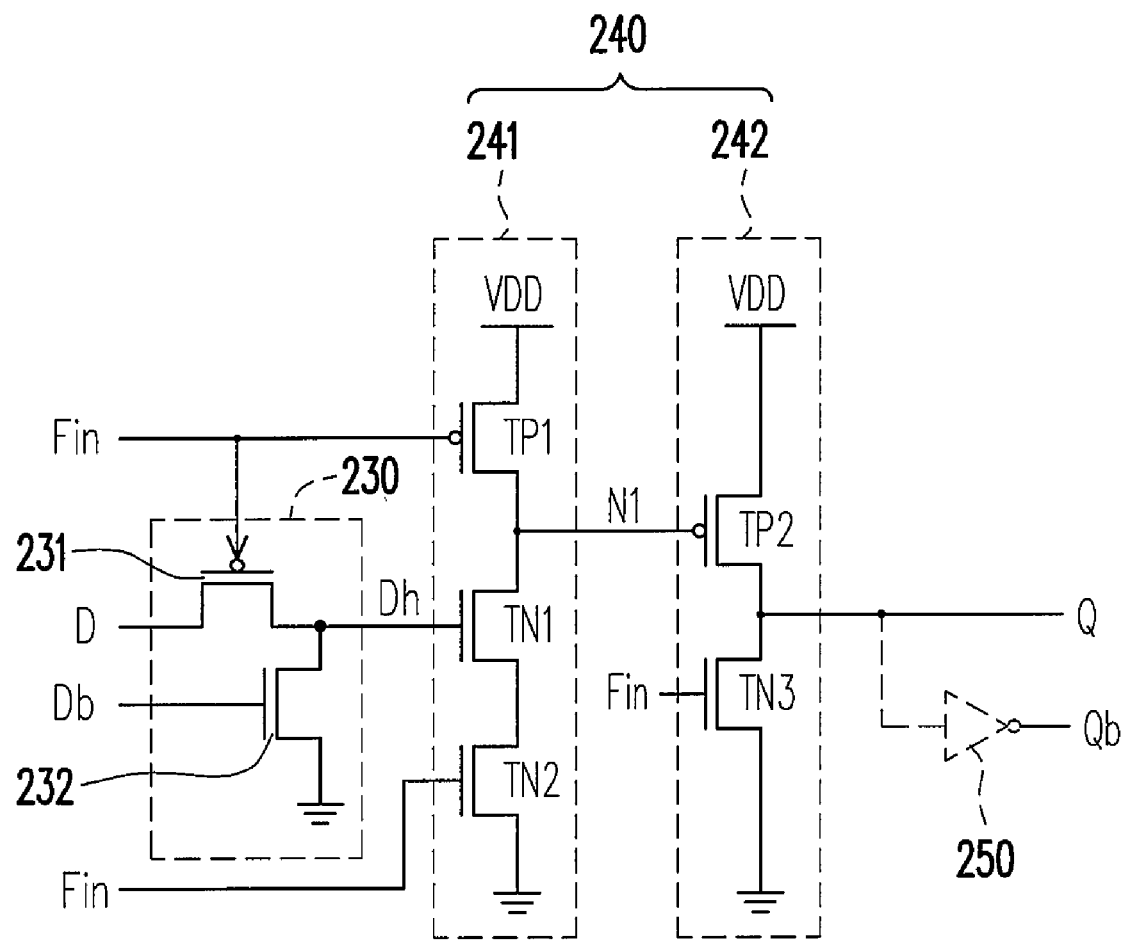
FIG. 2C illustrates a dynamic floating input D flip-flop according to an embodiment of the present invention.

Those of ordinary skill in the art may comply with the present invention by employing different types for the first flip-flop 212 and the second flip-flops 222 to 226. For example, FIG. 2C illustrates a dynamic floating input D flip-flop (DFIDFF) according to an embodiment of the present invention. Referring to FIG. 2C, the DFIDFF includes a floating input stage 230 and a latching stage 240. The floating input stage 230 transmits an input data D to an output terminal, namely to a node Dh shown in FIG. 2C, during a precharging period according to a clock sequence of the input frequency signal Fin. The latching stage 240 includes a first transistor array 241 and a second transistor array 242. Node Dh is also an input node of the first transistor array 241. The input node Dh is coupled to the output terminal of the floating input stage 230. According to the clock sequence of the input frequency signal Fin, during the precharging period the first transistor array 241 stores logic status of the input data D, and precharges an output node N1 to a first level, e.g., a power source voltage VDD. During an output period, the first transistor array 241 determines a level of the output node N1 of the first transistor array 241 according to the stored logic status of the input data D.

An input node of the second transistor array 242 is coupled to the output node N1 of the first transistor array 241. An output node of the second transistor array 242 provides a first output signal Q for the D flip-flop. According to the clock sequence of the frequency input signal Fin, the output node of the second transistor array 242 is floated during the precharging period. During the output period, a level of the first output signal Q outputted from the second transistor array 242 is determined according to the logic status of the output node N1 of the first transistor array 241.

According to an aspect of the present invention, the D flip-flop further includes a NOT gate 250. The NOT gate 250 comprises an input terminal coupled to the output node of the second transistor array 242, and an output terminal providing a second output signal Qb for the D flip-flop.

According to another aspect of the present invention, the first transistor array 241 further includes a P-type transistor TP1, an N-type transistor TN1 and an N-type transistor TN2. A source electrode of the transistor TP1 is coupled to the power source voltage VDD. A gate electrode of the transistor TP1 receives the frequency input signal Fin. A drain electrode of the transistor TP1 functions as the output node N1 of the first transistor array 241. A drain electrode of the transistor TN1 is coupled to the drain electrode of the transistor TP1. A gate electrode of the transistor TN1 functions as the input node Dh of the first transistor array 241. A drain electrode of the transistor TN2 is coupled to the source electrode, of the transistor TN1. A gate electrode of the transistor TN2 receives the frequency signal Fin. A source electrode of the transistor TN2 is grounded.

According to an aspect of the embodiment, the second transistor array 242 includes a P-type transistor TP2 and an N-type transistor TN3. A source electrode of the transistor TP2 is coupled to the power source voltage VDD. A gate electrode of the transistor TP2 functions as the input node of the second transistor array 242, and a drain electrode of the transistor TP2 functions as the output node of the second transistor array 242. A drain electrode of the transistor TN3 is coupled to the drain electrode of the transistor TP2. A gate electrode of the transistor TN3 receives the frequency input signal Fin, and a source electrode of the transistor TN3 is grounded.

According to an aspect of the present invention, the floating input stage 230 includes a switch 231. The switch 231 is turned on during the precharging period for transmitting the input data D of a first terminal thereof to the input node Dh of the first transistor array 241. During the output period, the switch 231 is turned off. The switch 231 is realized with a P-type transistor in this example. A source electrode and a drain electrode of the P-type transistor serve as a first terminal and a second terminal of the switch 231 respectively, and a gate electrode of the P-type transistor receives the frequency input signal Fin.

When the frequency input signal Fin is at a low level, i.e., during the precharging period, the switch 231 transmits the input data D to the node Dh, in which the input data D is going to be stored in a parasitic capacitance of the node Dh, and controls the conducting status of the N-type transistor TN1. When the frequency input signal Fin is at a low level, the transistor TP1 is turned on thus allowing the node N1 to be precharged to the power source voltage VDD. As the frequency input signal Fin increases to a high level, the transistor TP1 and the switch 231 will be turned off, and the transistors TN2 and TN3 will be turned on. The parasitic capacitance holds the input data D therein, and the conducting status of the transistor TN1 has been determined. As such, when the frequency input signal Fin is at a high level, i.e., during the output period, that a level of the node N1 is high or low can be determined immediately. A ratio circuit composed of the transistors TP2 and TN3 outputs the input data D as the first output signal Q of the D flip-flop. In this manner, the latching stage 240 is adapted for holding the data D during the precharging period, and transmitting the data D out during the output period.

In designing the D flip-flop circuit, because the embodiment employs a P-type transistor as the switch 231, when the input data D is at a low voltage, a leakage current is likely to occur because the P-type transistor is incapable of transmitting a complete 0V so that the transistor TN1 cannot be turned off completely. The performance of the circuit is accordingly affected. Considering this problem, an N-type transistor 232 can be employed in the floating input stage 230. The N-type transistor 232 includes a drain electrode coupled to the second terminal of the switch 231, a source electrode being grounded, and a gate electrode receiving an anti-phase signal Db of the input data D. The N-type transistor 232 is adapted for completely pulling the level of the node Dh to 0V, when the input data D is at the low level. Therefore, in designing, a small size transistor may be suitable for complying with the transistor 232.

Further, because the second transistor array 242 is a ratio circuit, more attention should be paid on designing the ratio between the transistors TP2 and TN3. According to practical need, a duty cycle of the output signal Q can be obtained by designing a ratio between sizes of the transistors TP2 and TN3, e.g., an output signal Q of 50% of duty cycle.

Figure 3:
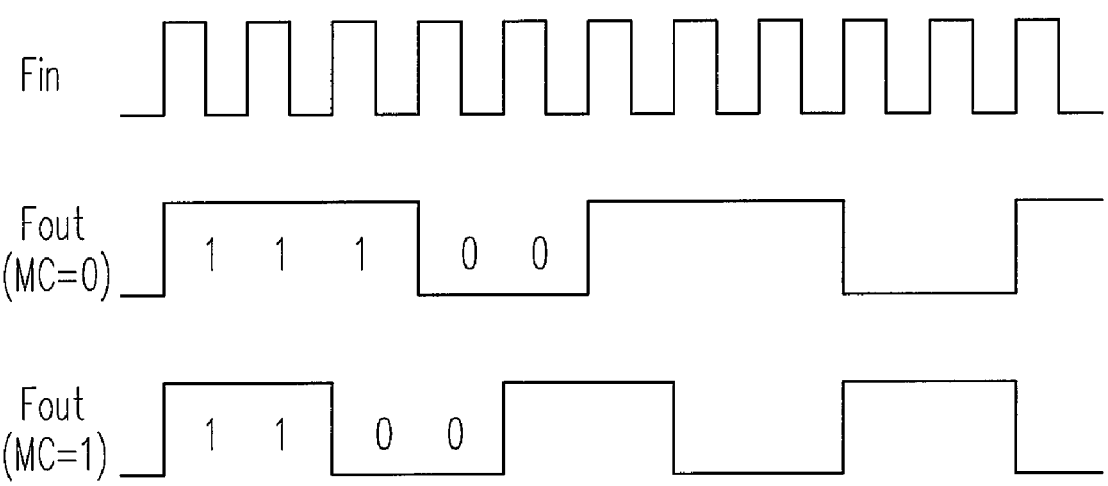
FIG. 3 is a clock sequence diagram of input and output signals of a divider 200 which is set as a divided-by-4 divider or a divided-by-5 divider according to an embodiment of the present invention.

Referring to FIGS. 2A and 2B, suppose N=2, and MC=0, as an example, the divider 200 exhibits a function of dividing with 5. FIG. 3 illustrates input and output clock sequence of the divider 200 when set to be a divided-by-4 divider or a divided-by-5 divider. When the last second flip-flop of the flip-flop array outputs a logic "0", which is equivalent to that the output frequency Fout is logic "1", the logic "0" passes through the first flip-flop 212 and two second flip-flops. When the last second flip-flop of the flip-flop array alternatively outputs a logic "1", which is equivalent to that the output frequency Fout changes to logic "0", the logic "1" passes through the two second flip-flops while the logic "1" cannot pass through the first flip-flop 212. In this manner, a waveform of the output frequency Fout of the divider 200 includes three "1" and two "0", thus configuring a divided-by-5 circuit. Likewise, referring to FIGS. 2A and 3, when N=2, and MC=1, the divider 200 exhibits a function of divided-by-4.

Figure 4:
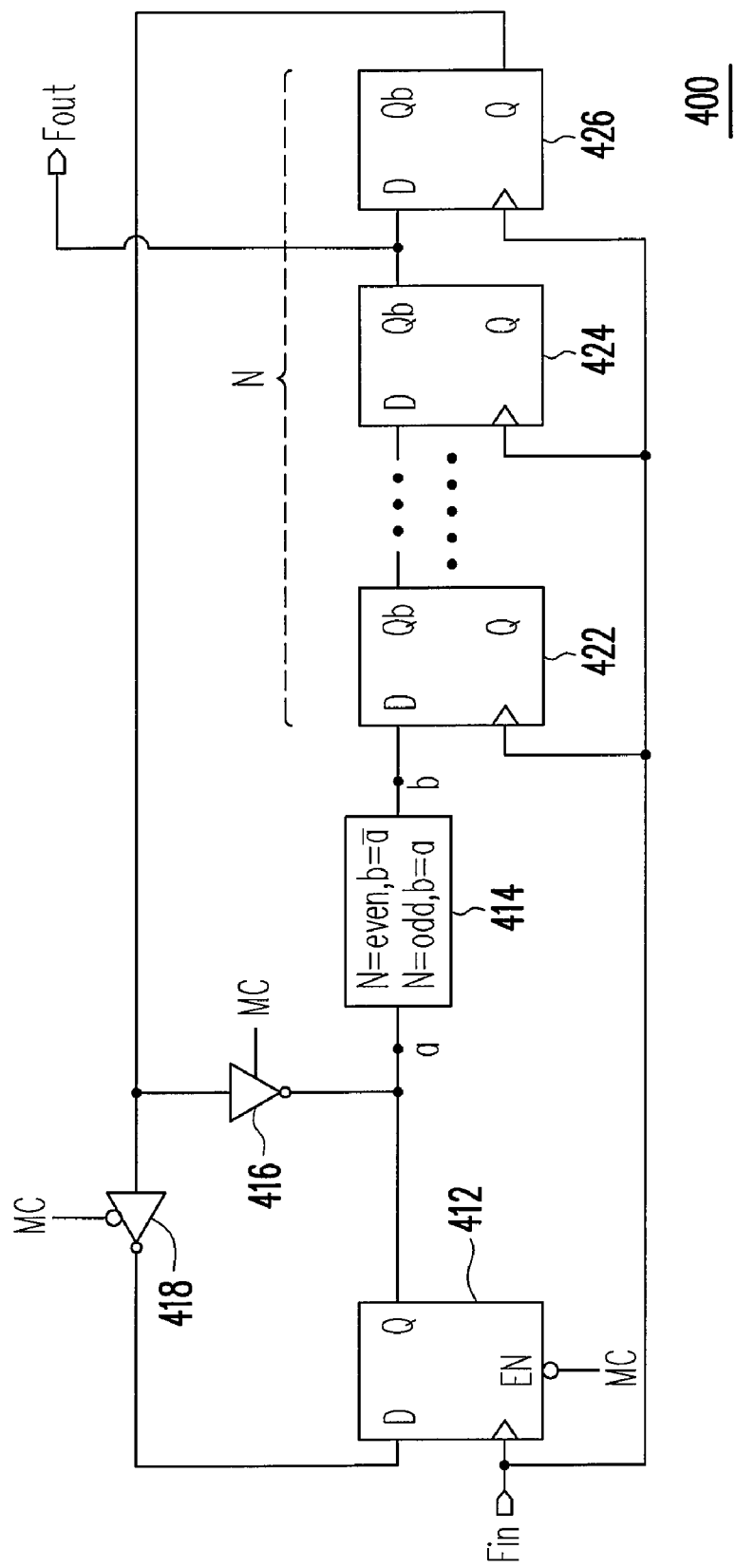
FIG. 4 illustrates another divider according to an embodiment of the present invention.

Those of ordinary skill in the art may modify the divider 200 in accordance with the practical need. For example, as shown in FIG. 4, a divider 400 according to another embodiment of the present invention is provided. The divider 400 includes a first flip-flop 412, a flip-flop array composed of N second flip-flops 422, 424, 426 connected in series, a first NOT gate 418, a second NOT gate 416, and a circuit 414, wherein N is an integer greater than 0.

Referring to FIG. 4, each second flip-flop of the flip-flop array includes negative output terminal Qb coupled to an input terminal D of an adjacent second flip-flop. The first flip-flop 412 and the second flip-flops 422 to 426 can be triggered by a frequency signal Fin. The first flip-flop 412 is controlled by a mode control signal MC for determining whether or not to enable. The first NOT gate 418 has an input terminal coupled to a positive input terminal Q of the last second flip-flop 426 of the flip-flop array, and an output terminal coupled to the input terminal D of the first flip-flop 412. The second NOT gate 416 has an input terminal coupled to the positive input terminal Q of the last second flip-flop 426 of the flip-flop array. The NOT gates 418 and 416 are all controlled by the mode control signal MC for determining whether or not to enable.

Those of ordinary skill in the art should be aware of many approaches for realizing the second flip-flops 422 to 426. For example, dynamic floating input D-type flip-flops as shown in FIG. 2C can be used for the second flip-flops 422 to 426.

If N is an odd number, that is there are an odd number of second flip-flops in the flip-flop array, then the circuit 414 includes a wire. The wire has a terminal coupled to the output terminal of the first flip-flop 412 and the output terminal of the second NOT gate 416, and another terminal coupled to the input terminal D of the first second flip-flop 422 of the flip-flop array. If N is an even number, then the circuit 414 includes a third NOT gate. The third NOT gate has an input terminal coupled to the output terminal of the first flip-flop 412 and the output terminal of the second NOT gate 416, and another terminal coupled to the input terminal D of the first second flip-flop 422 of the flip-flop array.

If the mode control signal MC is logic "1", then the first NOT gate 418 and the first flip-flop 412 are disabled, and the second NOT gate 416 is enabled. As such, the output of the last second flip-flop 426 of the flip-flop array is transmitted directly through the second NOT gate 416 and the circuit 414 to the first second flip-flop 422 of the flip-flop array, without passing through the first flip-flop 412, and thus configuring a divided-by-2N divider, in which the out frequency Fout of the divider is equivalent to the frequency signal Fin divided by 2N.

If the mode control signal MC is logic "0", then the first NOT gate 418 and the first flip-flop 412 are enabled, and the second NOT gate 416 is disabled. As such, logic "1" outputted from the last second flip-flop 426 of the flip-flop array is transmitted through the first flip-flop 416, in which the logic "1" is delayed one duty cycle of the frequency signal Fin before the logic "1" arrives the first second flip-flop 422 via the circuit 414. After an output of the last second flip-flop 426 is changed from logic "1" to logic "0", the first NOT gate 418 and the first flip-flop 412 are disabled, and the second NOT gate 416 is enabled, in which logic "0" cannot pass through the first flip-flop 412. As such, a divided-by-(2N+1) divider is configured by repeating the above operation, in which an output frequency Fout of the divider 400 is equivalent to the input frequency signal Fin divided by 2N+1.

Figure 5:
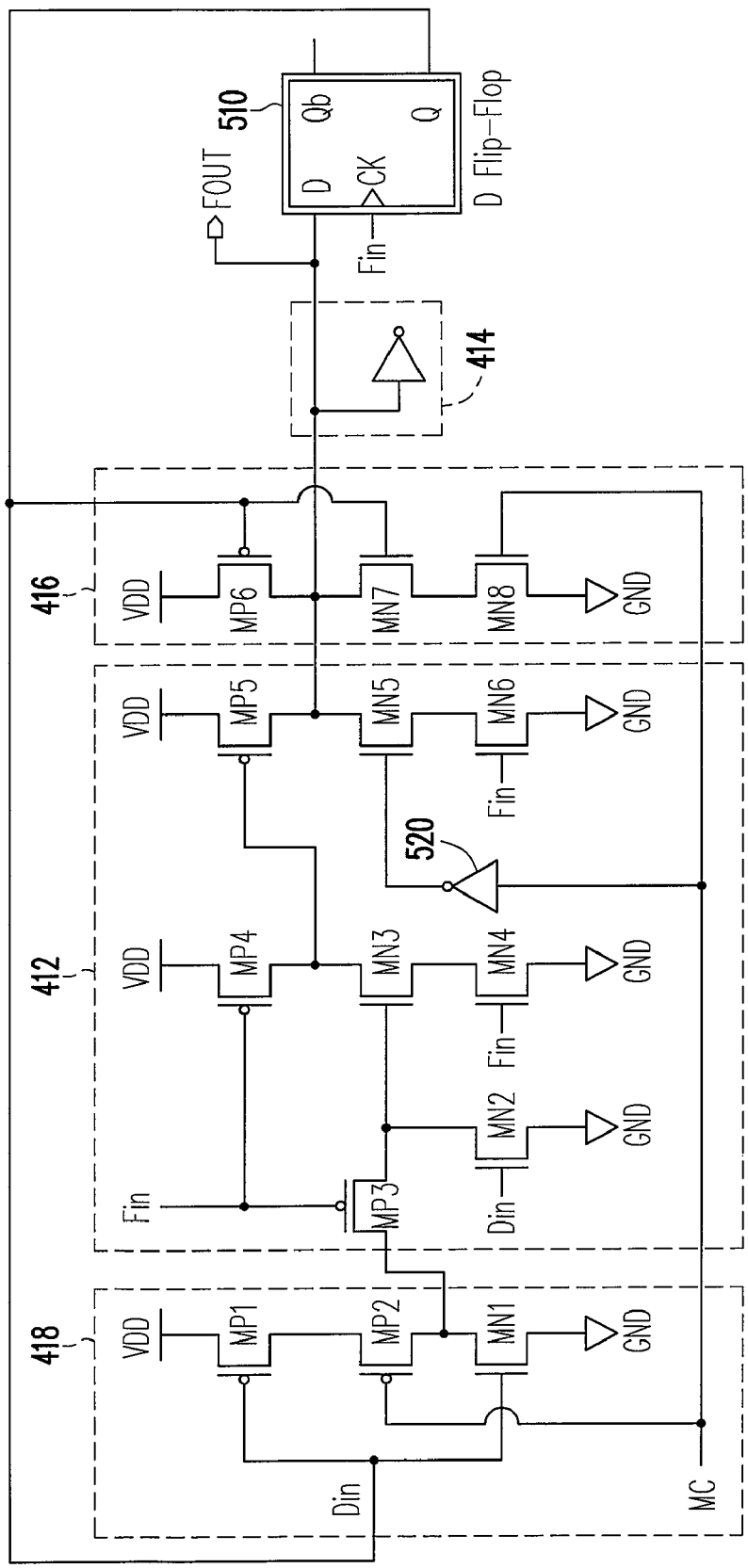
FIG. 5 illustrates a divider 400 set as a divided-by-2 divider or a divided-by-3 divider according to an embodiment of the present invention.

For example, when N=1, and MC=0, the divider exhibits a function of divided-by-3, and when N=1, and MC=1, the divider exhibits a function of divided-by-2. FIG. 5 illustrates the divider 400 set as a divided-by-2 divider or a divided-by-3 divider according to an embodiment of the present invention. In the present embodiment, the flip-flop array includes only one second flip-flop 510, in which N=1. Therefore, the signal of the input terminal D of the second flip-flop 510 is the output frequency Fout of the divider 400.

Referring to FIG. 5, the first NOT gate 418 includes a first P-type transistor MP1, a second P-type transistor MP2, and a first N type transistor MN1. The transistor MP1 has a source electrode coupled to a first voltage, e.g., in the present embodiment suppose to be a system voltage VDD, a gate electrode serves as an input terminal of the first NOT gate 418 for receiving an output signal Din of the last second flip-flop 510 of the flip-flop array. The transistor MP2 has a source electrode coupled to a drain electrode of the transistor MP1, a gate electrode coupled to the mode control signal MC, and a drain electrode as an output terminal of the first NOT gate 418. The transistor MN1 has a drain electrode coupled to the drain electrode of the transistor MP2, a gate electrode coupled to the gate electrode of the transistor MP1, and a source electrode coupled to a second voltage, e.g., in the current embodiment suppose to be a ground voltage GND.

Referring to FIG. 5, the first flip-flop 412 includes a third P-type transistor MP3, a second N-type transistor MN2, a fourth P-type transistor MP4, a third N-type transistor MN3, a fourth N-type transistor MN4, a fifth P-type transistor MP5, a fifth N-type transistor MN5, and a sixth N-type transistor MN6. The transistor MP3 has a source electrode coupled to the output terminal of the first NOT gate 418 and a gate electrode receiving the frequency signal Fin. The transistor MN2 has a drain electrode coupled to a drain electrode of the transistor MP3 and a source electrode coupled to a grounded voltage GND. The transistor MN2 has a gate electrode coupled to a positive output terminal Q of the last second flip-flop 510 of the flip-flop array for receiving the signal Din. The transistor MP4 has a source electrode coupled to the system voltage VDD and a gate electrode receiving the frequency signal Fin. The transistor MN3 has a drain electrode coupled to the drain electrode of the transistor MP4 and a gate electrode coupled to the drain electrode of the transistor MP3. The transistor MN4 has a drain electrode coupled to the source electrode of the transistor MN3, a gate electrode receiving the frequency signal Fin, and a source electrode coupled to a grounded voltage GND. The transistor MP5 has a source electrode coupled to the system voltage VDD, a gate electrode coupled to the drain electrode of the transistor MP4, and a drain electrode as an output terminal of the first flip-flop 412. The transistor MN5 has a drain electrode coupled to the drain electrode of the transistor MP5, and a gate electrode receiving an anti-phase signal of the mode control signal MC. In the present embodiment, the anti-phase signal of the mode control signal MC is obtained by converting the mode control signal MC with an inverter 520. The transistor MN6 has a drain electrode coupled to the source electrode of the transistor MN5, a gate electrode receiving the frequency signal Fin, and a source electrode coupled to a grounded voltage GND.

Referring to FIG. 5, the second NOT gate 416 includes a sixth P-type transistor MP6, a seventh N-type transistor MN7, and an eighth N-type transistor MN8. The transistor MP6 has a source electrode coupled to the system voltage VDD, a gate electrode serving as an input terminal of the second NOT gate 416, and a drain electrode serving as an output terminal of the second NOT gate 416. The transistor MN7 has a drain electrode coupled to the drain electrode of the transistor MP6, and a gate electrode coupled to the gate electrode of the transistor MP6. The transistor MN8 has a drain electrode coupled to a source electrode of the transistor MN7, a gate electrode receiving the mode control signal MC, and a source electrode coupled to a grounded voltage GND.

Figure 6:
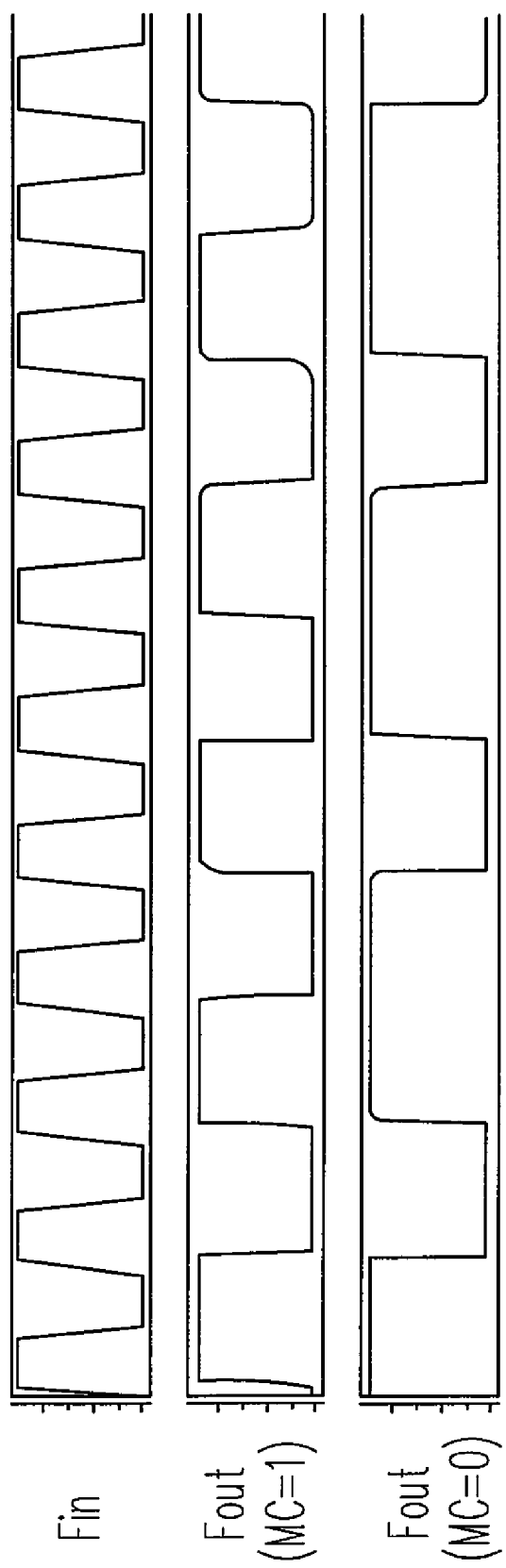
FIG. 6 is a clock sequence diagram illustrating the divider shown in FIG. 5.

FIG. 6 is a clock sequence diagram illustrating the divider shown in FIG. 5. Referring to FIGS. 5 and 6, when MC=1, i.e., performing divided-by-2, the first NOT gate 418 and the first flip-flop 412 are disabled, and the second NOT gate 416 is enabled. An output of the last second flip-flop 510 of the flip-flop array is transmitted directly through the second NOT gate 416 and the circuit 414 to the first second flip-flop 510 of the flip-flop array without passing through the first flip-flop 412. Therefore this configures a divided-by-2N divider. When MC=0, i.e., going to perform divided-by-3, the first NOT gate 418 and the first flip-flop 412 are enabled, and the second NOT gate 416 is disabled. As the last second flip-flop 510 of the flip-flop array output a logic "1", the logic "1" passes through the first NOT gate 418, the first flip-flop 412 and the circuit 414, and then arrives at the second flip-flop 510. As the last second flip-flop 510 of the flip-flop array changes to output a logic "0", the logic "0" enables the second NOT gate 416 and then outputs a logic "1" to the circuit 414. In such a way, a waveform of the output frequency Fout of the divider 400 includes two "1" and one "0", thus configuring a divided-by-3 circuit.

Figure 7:
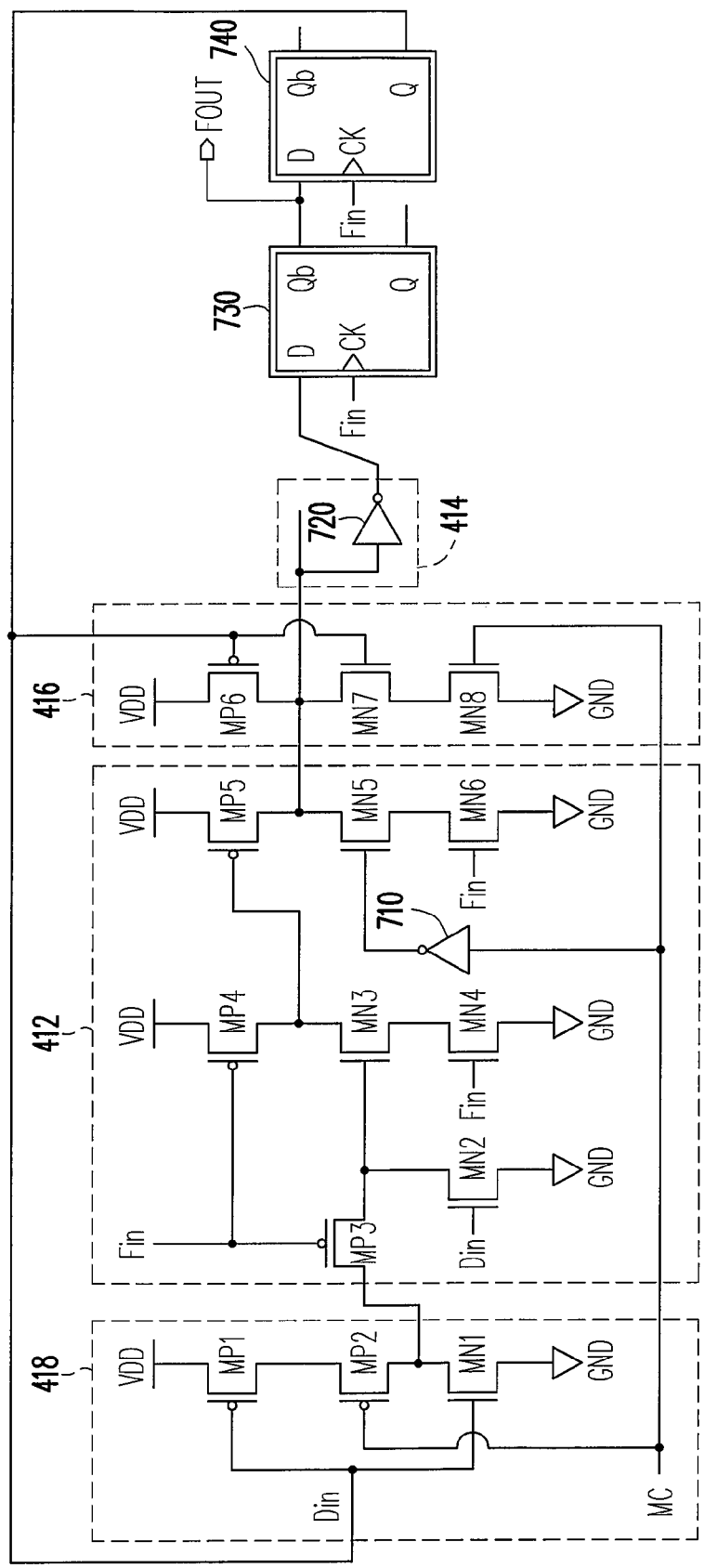
FIG. 7 illustrates a divider 400 serving as a divided-by-(⅘) divider according to an embodiment of the present invention.

Further, when N=2, and MC=1, the divider would function to divide with 4, and when N=2, and MC=0, the divider would function to divide with 5. FIG. 7 illustrates an embodiment of the present invention which sets the divider 400 as a divided-by-(⅘) divider. In this embodiment, the flip-flop array includes two second flip-flops 730 and 740, i.e., N=2. An output signal of a negative output terminal Qb of the second flip-flop 730 is the output frequency Fout of the divider 400.

Referring to FIG. 7, the first NOT gate 418, the first flip-flop 412 and the second NOT gate 416 can be learnt by referring to FIG. 5 and the description thereof is omitted. In the present embodiment, N is an even number, and therefore the circuit 414 includes a third NOT gate 720.

Figure 8:
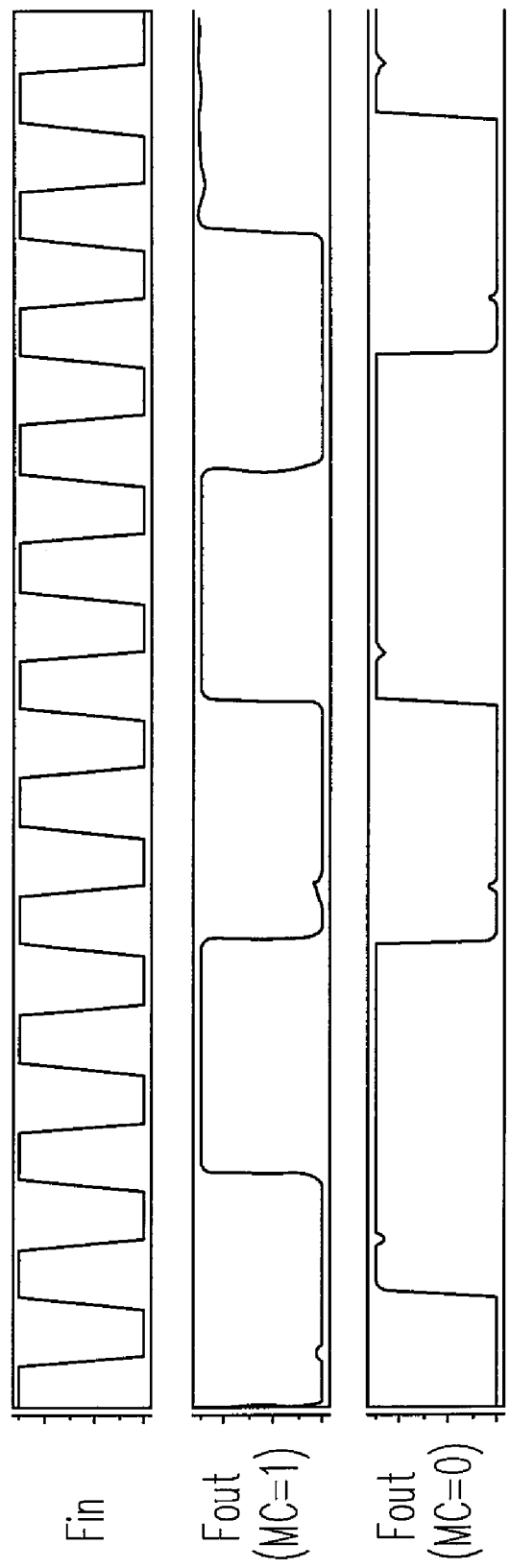
FIG. 8 is a clock sequence diagram of input and output signals of the divider shown in FIG. 7.

FIG. 8 is a clock sequence diagram of input and output signals of the divider shown in FIG. 7. Referring to FIGS. 7 and 8, when MC=1, i.e., performing divided-by-4, the first NOT gate 418 and the first flip-flop 412 are disabled, and the second NOT gate 416 is enabled. Therefore, an output of the last second flip-flop 740 of the flip-flop array is transmitted directly through the second NOT gate 416 and the third NOT gate 720 of the circuit 414 to the first second flip-flop 730 of the flip-flop array without passing through the first flip-flop 412. In such a way, a divided-by-4 divider is configured.

When MC=0, the divider is going to divide with 5. Meanwhile, the first NOT gate 418 and the first flip-flop 412 are enabled, and the second NOT gate 416 is disabled. When an output of the last second flip-flop 740 of the flip-flop array is a logic "1", the logic "1" is transmitted through the first NOT gate 418, the first flip-flop 412, and the third NOT gate 720 of the circuit 414, and then arrives at the second flip-flop 730. When the output of the last second flip-flop 740 of the flip-flop array is changed to a logic "0", the logic "0" enables the second NOT gate 416 and thus outputting a logic "1" to the third NOT gate 720 of the circuit 414. Therefore, the waveform of the output frequency Fout of the divider 400 includes three "1" and two "0", thus configuring a divided-by-5 divider.

Figure 9:
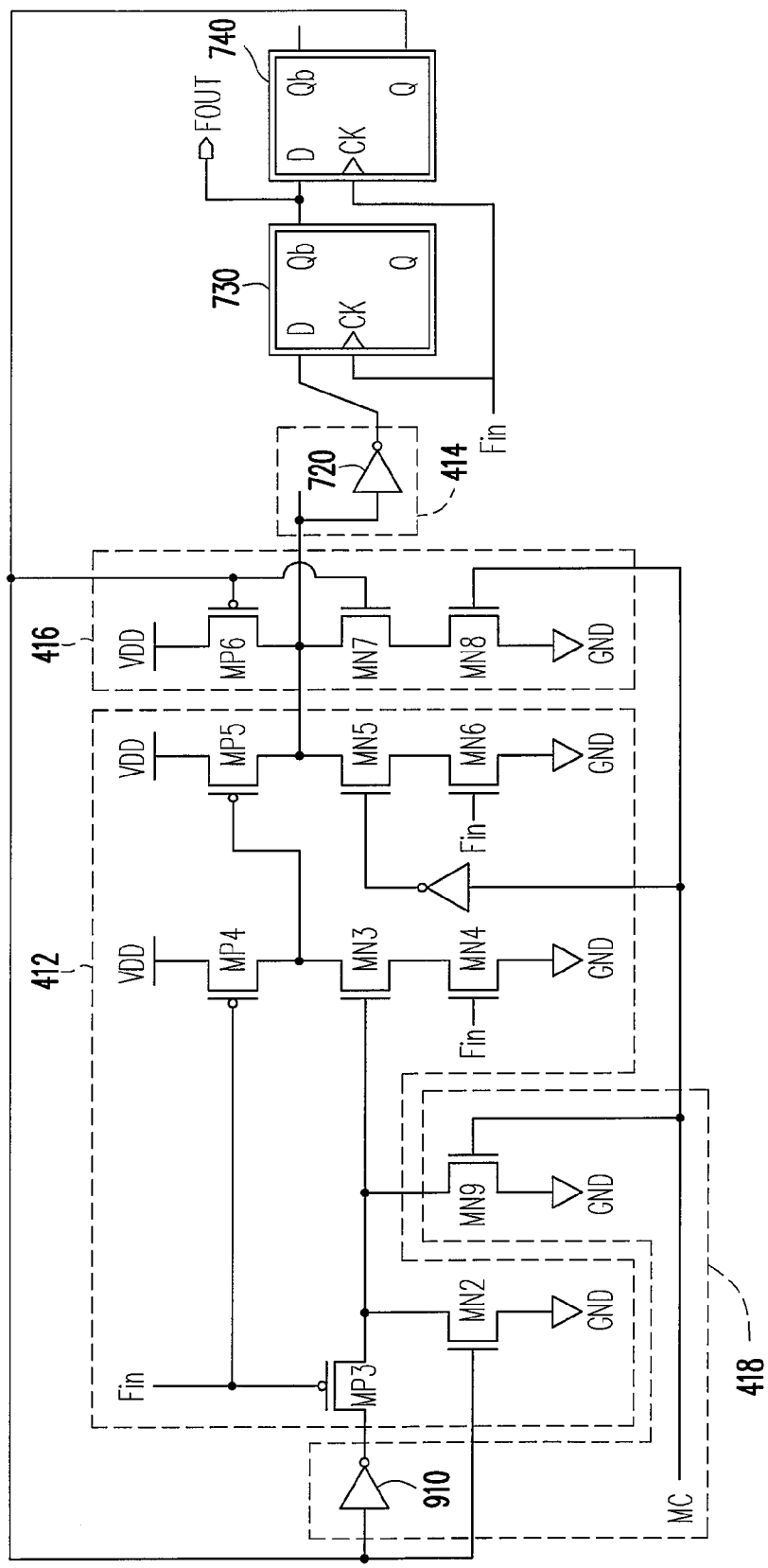
FIG. 9 is illustrates a first NOT gate 418 shown in FIG. 7 according to another embodiment of the present invention.

Those of ordinary skill in the art should be able to modify the embodiment as shown in FIG. 7 according to the spirit of the present invention and within the scope of the present invention. For example, FIG. 9 is illustrates another embodiment of the first NOT gate 418 shown in FIG. 7. As shown in FIG. 9, the first NOT gate 418 includes an inverter 910 and a ninth transistor MN9. The inverter 910 has an input terminal coupled to a positive output terminal of the last second flip-flop of the flip-flop array, for receiving the output signal Din of the last second flip-flop of the flip-flop array. The inverter 910 has an output terminal coupled to the source electrode of the transistor MP3. The transistor MN9 has a drain electrode coupled to a drain electrode of the transistor MP3, and a gate electrode receiving the mode control signal MC, and a source electrode coupled to a grounded voltage GND.

Figure 1B:
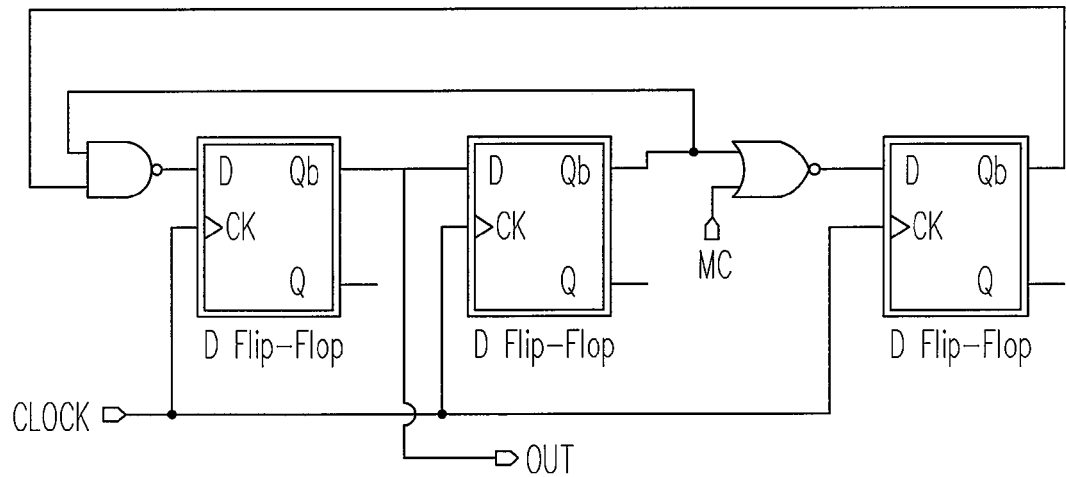
FIG. 1B is a circuit of a conventional divided-by-(⅘) divider.

Finally, as shown in Table 1, the parameters for the divider according to the present invention are summarized, in which a conventional a divided-by-(4/5) divider, as shown in FIG. 1B in which the D flip-flop is a DFIDFF shown in FIG. 2C, is compared with the divided-by-(4/5) divider of the foregoing embodiments according to the present invention, as shown in FIGS. 7 and 9, in which the D flip-flop is also a DFIDFF shown in FIG. 2C, after being simulated. Under same conditions of 0.13 μm processing, 0.5v operation voltage, and environmental operation temperature, the fastest operation frequencies, power consumptions, power delay products (PDP), and normalized PDP of the divided-by-4 or divided-by-5 circuit are listed and compared. It can be concluded from Table 1 that the fastest operation frequencies of the divided-by-(4/5) divider is drastically improved compared to the conventional divided-by(4/5) divider.

The divider according to the present invention employs serially connected DFIDFFs, control signal MC and switches for inputting data, and increases the operation frequency at a super low operation voltage, e.g., 0.5v. The times of dividing can be determined by determining the N value, i.e., number of the second flip-flops. Further, all of the foregoing embodiments are suitable for high speed operation in an environment of a low voltage and a high speed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A divider, comprising:
   a first flip-flop, being triggered by a frequency signal and being controlled by a mode control signal for enabling;
   a flip-flop array, comprising N second flip-flops, wherein N is an integer greater than 0, and a negative output terminal of each second flip-flop of the flip-flop array is coupled to an input terminal of an adjacent second flip-flop;
   a first NOT gate, having an input terminal coupled to a positive output terminal of the last second flip-flop of the flip-flop array, and an output terminal coupled to an input terminal of the first flip-flop, wherein the first NOT gate is controlled by the mode control signal for enabling;
   a second NOT gate, having an input terminal coupled to the positive output terminal of the last second flip-flop of the flip-flop array, wherein the second NOT gate is controlled by the mode control signal for enabling; and
   a circuit, wherein when N is an odd number, the circuit comprises a wire having a terminal coupled to an output terminal of the first flip-flop and an output terminal of the second NOT gate, and the other terminal coupled to an input terminal of the first second flip-flop of the flip-flop array; and when N is an even number, the circuit comprises a third NOT gate having an input terminal coupled to the output terminal of the first flip-flop and the output terminal of the second NOT gate, and an output terminal coupled to an input terminal of the first second flip-flop of the flip-flop array.

2. The divider according to claim 1, wherein when the mode control signal indicates that the divider is a divided-by-2N divider, then the first flip-flop and the first NOT gate are disabled, and the second NOT gate is enabled.

3. The divider according to claim 1, wherein if the mode control signal indicates that the divider is a divided-by-(2N+1) divider, then the first flip-flop and the first NOT gate are enabled; and when the input terminal of the second NOT gate is logic "1", then the second NOT gate is disabled, and if the input terminal of the second NOT gate is logic "0", then the second NOT gate is enabled.

4. The divider according to claim 1, wherein the first NOT gate comprises:
   a first P-type transistor, having a source electrode coupled to a first voltage and a gate electrode serving as the input terminal of the first NOT gate;
   a second P-type transistor, having a source electrode coupled to a drain electrode of the first P-type transistor,

TABLE 1

| Divided-by-(4/5) divider | Highest Frequency (MHz) | Power(uW) Divided by 4 | Divided by 5 | PDP(fJ) Divided by 4 | Divided by 5 | Normalized PDP Divided by 4 | Divided by 5 |
|---|---|---|---|---|---|---|---|
| FIG. 1B | 555 | 6.82 | 8.36 | 12.3 | 15.1 | 0.95 | 1.15 |
| FIG. 9 | 613 | 7.75 | 8.02 | 12.9 | 13.1 | 1 | 1 |
| FIG. 7 | 613.4 | 5.823 | 7.497 | 9.49 | 12.22 | 0.74 | 0.93 | a gate electrode for receiving the mode control signal, and a drain electrode serving as the output terminal of the first NOT gate; and a first N-type transistor, having a drain electrode coupled to the drain electrode of the second P-type transistor, a gate electrode coupled to the gate electrode of the first P-type transistor, and a source electrode coupled to a second voltage.

5. The divider according to claim 1, wherein the first flip-flop comprises:

a third P-type transistor, having a source electrode coupled to the output terminal of the first NOT gate and a gate electrode receiving the frequency signal;

a second N-type transistor, having a drain electrode coupled to a drain electrode of the third P-type transistor, a gate electrode coupled to a positive output terminal of the last second flip-flop of the flip-flop array, and a source electrode coupled to a second voltage;

a fourth P-type transistor, having a source electrode coupled to a first voltage and a gate electrode for receiving the frequency signal;

a third N-type transistor, having a drain electrode coupled to a drain electrode of the fourth P-type transistor, and a gate electrode coupled to a drain electrode of the third P-type transistor;

a fourth N-type transistor, having a drain electrode coupled to a source electrode of the third N-type transistor, a gate electrode for receiving the frequency signal, and a source electrode coupled to the second voltage;

a fifth P-type transistor, having a source electrode coupled to the first voltage, a gate electrode coupled to a drain electrode of the fourth P-type transistor, and a drain electrode as an output terminal of the first flip-flop;

a fifth N-type transistor, having a drain electrode coupled to the drain electrode of the fifth P-type transistor, and a gate electrode for receiving an anti-phase signal of the mode control signal; and a sixth N-type transistor, having a drain electrode coupled to a source electrode of the fifth N-type transistor, a gate electrode receiving the frequency signal, and a source electrode coupled to the second voltage.

6. The divider according to claim 5, wherein the first NOT gate comprises:

an inverter, having an input terminal coupled to a positive output terminal of the last second flip-flop of the flip-flop array, and an output terminal coupled to the source electrode of the third P-type transistor; and a ninth N-type transistor, having a drain electrode coupled to the drain electrode of the third P-type transistor, a gate electrode receiving the mode control signal, and a source electrode coupled to the second voltage.

7. The divider according to claim 1, wherein the second NOT gate comprises:

a sixth P-type transistor, having a source electrode coupled to a first voltage, a gate electrode as the input terminal of the second NOT gate, and a drain electrode serving as the output terminal of the second NOT gate;

a seventh N-type transistor, having a drain electrode coupled to the drain electrode of the sixth P-type transistor, and a gate electrode coupled to the gate electrode of the sixth P-type transistor; and an eighth N-type transistor, having a drain electrode coupled to a source electrode of the seventh N-type transistor, a gate electrode for receiving the mode control signal, and a source electrode coupled to a second voltage.

8. A divider, comprising:

a first flip-flop, being triggered by a frequency signal;

a flip-flop array, comprising N second flip-flops, N being an integer greater than 0, wherein a negative output terminal of each second flip-flop of the flip-flop array is coupled to an input terminal of a second flip-flop next thereto;

a first switch, having a first terminal coupled to a negative output terminal of the last second flip-flop of the flip-flop array, and a second terminal coupled to an input terminal of the first flip-flop, wherein the first switch is controlled for conduction by a mode control signal;

a second switch, having a first terminal coupled to the negative output terminal of the last second flip-flop of the flip-flop array, wherein the second switch is controlled for conduction by the mode control signal;

a third switch, having a first terminal coupled to the output terminal of the first flip-flop, and a second terminal coupled to a second terminal of the second switch, wherein the third switch is controlled for conduction by the mode control signal; and a circuit, wherein when N is an odd number, the circuit comprises a wire having a terminal coupled to the second terminal of the second switch, and the other terminal coupled to the input terminal of the first second flip-flop of the flip-flop array; and when N is an even number, the circuit comprises a third NOT gate having an input terminal coupled to the second terminal of the second switch, and an output terminal coupled to an input terminal of the first second flip-flop of the flip-flop array.

9. The divider according to claim 8, wherein when the mode control signal indicates that the divider is a divided-by-2N divider, then the first switch and the third switch are turned off, and the second switch is turned on.

10. The divider according to claim 8, wherein when the mode control signal indicates that the divider is a divided-by-(2N+1) divider, then the first switch and the third switch are turned on; and when the first terminal of the second switch is logic "0", then the second switch is turned off, and when the first terminal of the second switch is logic "1", then the second switch is turned on.

* * * * *